US008878364B2

(12) United States Patent
Morita et al.

(10) Patent No.: US 8,878,364 B2
(45) Date of Patent: Nov. 4, 2014

(54) METHOD FOR FABRICATING SEMICONDUCTOR DEVICE AND SEMICONDUCTOR DEVICE

(71) Applicant: Kabushiki Kaisha Toshiba, Tokyo (JP)

(72) Inventors: Toshiyuki Morita, Mie (JP); Akitsugu Hatazaki, Mie (JP); Kazumasa Ito, Mie (JP); Hiroshi Toyoda, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/768,178

(22) Filed: Feb. 15, 2013

(65) Prior Publication Data

US 2014/0054782 A1   Feb. 27, 2014

(30) Foreign Application Priority Data

Aug. 23, 2012 (JP) .................. 2012-183936

(51) Int. Cl.
H01L 23/48     (2006.01)
H01L 23/52     (2006.01)
H01L 23/532    (2006.01)
H01L 21/768    (2006.01)

(52) U.S. Cl.
CPC ............ H01L 23/52 (2013.01); H01L 23/5329 (2013.01); H01L 23/53295 (2013.01); H01L 23/53238 (2013.01); H01L 21/768 (2013.01)
USPC ........... 257/762; 257/751; 257/758; 257/773; 257/774; 438/618; 438/622; 438/635; 438/643; 438/663

(58) Field of Classification Search
None
See application file for complete search history.

(56) References Cited

U.S. PATENT DOCUMENTS 6,146,993 A * 11/2000 Brown et al. ............ 438/627
6,451,388 B1 * 9/2002 Tada et al. .............. 427/576
2008/0023838 A1   1/2008 Sakata et al.
2011/0227224 A1   9/2011 Kitao

FOREIGN PATENT DOCUMENTS

JP   2001-274160   10/2001
JP   4498391       4/2010
JP   2010-192467   9/2010
JP   2011-199021   10/2011

* cited by examiner

Primary Examiner — Kyoung Lee
(74) Attorney, Agent, or Firm — Oblon, Spivak, McClelland, Maier & Neustadt, L.L.P.

(57) ABSTRACT

A method for fabricating a semiconductor device according to an embodiment, includes forming a dielectric film above a substrate; forming an opening in the dielectric film; forming a high melting metal film on a side wall and a bottom surface of the opening; forming a seed film of copper (Cu) on the high melting metal film; performing nitriding process after the seed film is formed; and performing electroplating process, in which a Cu film is buried in the opening while energizing the seed film after performing nitriding process.

17 Claims, 5 Drawing Sheets

| | A | B | C |
|---|---|---|---|
| Void Formation Rate | 75% | 0% | 0% |
| Faulty Wiring Rate | 80% | 65% | 0% |

METHOD FOR FABRICATING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2012-183936 filed on Aug. 23, 2012 in Japan, the entire contents of which are incorporated herein by reference.

FIELD

Embodiments described herein relate generally to a method for fabricating a semiconductor device and a semiconductor device.

BACKGROUND

In recent years, with increases in integration density and performance of a semiconductor integrated circuit (LSI), a new micro fabrication technique has been developed. In particular, in order to speed up LSI, there has been more progress recently in changing wire materials from aluminum (Al) alloy, which has been used, to copper (Cu) or Cu alloy (i.e. Cu-containing material, collectively referred to as Cu hereinafter) having a low resistance. Micro fabrication of Cu by a dry etching process such as a reactive ion etching (RIE) that has been frequently used in formation of Al alloy wires is difficult. Therefore, a so-called damascene process, in which a Cu film is deposited on a grooved dielectric film, and the Cu film except for portions embedded in grooves is removed by chemical-mechanical polishing (CMP) method to form buried wires, is mainly used. In formation of Cu wires, grooves are formed on a dielectric film and then a titanium (Ti) film, as an example, is formed as a base metal film (barrier metal film) for preventing diffusion of Cu. It is common that a thin Cu seed film is thereafter formed on the surface by a sputter process and the like, and a laminated film having about hundreds of nanometers is formed by an electroplating process. Further, when multilayered Cu wires are formed, a wire forming method called dual damascene structure may be used. With this method, a dielectric film is deposited on lower layer wires, predetermined via holes (holes) and trenches for upper layer wires (wiring grooves) are formed, and then a barrier metal film and a Cu seed film are formed. Thereafter, Cu as a wire material is buried in the via holes and the trenches at the same time, and unwanted Cu on the upper layer is removed by CMP to planarize, whereby buried wires are formed.

With electroplating process, Cu is selectively grown from the surface of a Cu seed film on a groove bottom (bottom-up growth) to bury Cu in wiring grooves without void, whereby Cu wires are formed. However, when the aspect ratio of grooves increases, it becomes difficult to form the Cu seed film on the side wall of the groove with a sufficient amount. This causes so-called film breakage of the Cu seed film. At the film breakage portions, Ti as the base metal film is exposed to the surface. At portions where Ti is exposed to the surface, Ti oxide is easily formed, and a Cu film cannot be formed on the Ti oxide since Cu growth is difficult on the Ti oxide by the plating method. As a result, voids are formed from the portions where Ti is exposed to the surface in the following Cu plating film formation. With future miniaturization, Cu has to be buried at a high aspect ratio upon the formation of a Cu film and it is difficult to avoid the present situation. Therefore, immediate countermeasures are desired.

DETAILED DESCRIPTION

First Embodiment

A method for fabricating a semiconductor device according to an embodiment, includes forming a dielectric film above a substrate; forming an opening in the dielectric film; forming a high melting metal film on a side wall and a bottom surface of the opening; forming a seed film of copper (Cu) on the high melting metal film; performing nitriding process after the seed film is formed; and performing electroplating process, in which a Cu film is buried in the opening while energizing the seed film after performing nitriding process.

A semiconductor device according to an embodiment, includes a copper (Cu) wire, a high melting metal film, a nitride film of the high melting metal film, and a dielectric film. The high melting metal film is formed to cover a side surface and a bottom surface of the Cu wire. The nitride film of the high melting metal film is locally formed close to a contact point between the side surface and the bottom surface of the Cu wire in such a manner that the nitride film is sandwiched between the Cu wire and the high melting metal film. The dielectric film is formed at a side of the copper wire with the high melting metal film interposed therebetween.

In the following embodiment, a method for fabricating a semiconductor device in which Cu wires without void are formed, and the semiconductor device are described. Hereinafter, a first embodiment will be described referring to the accompanying drawings.

Figure 1:
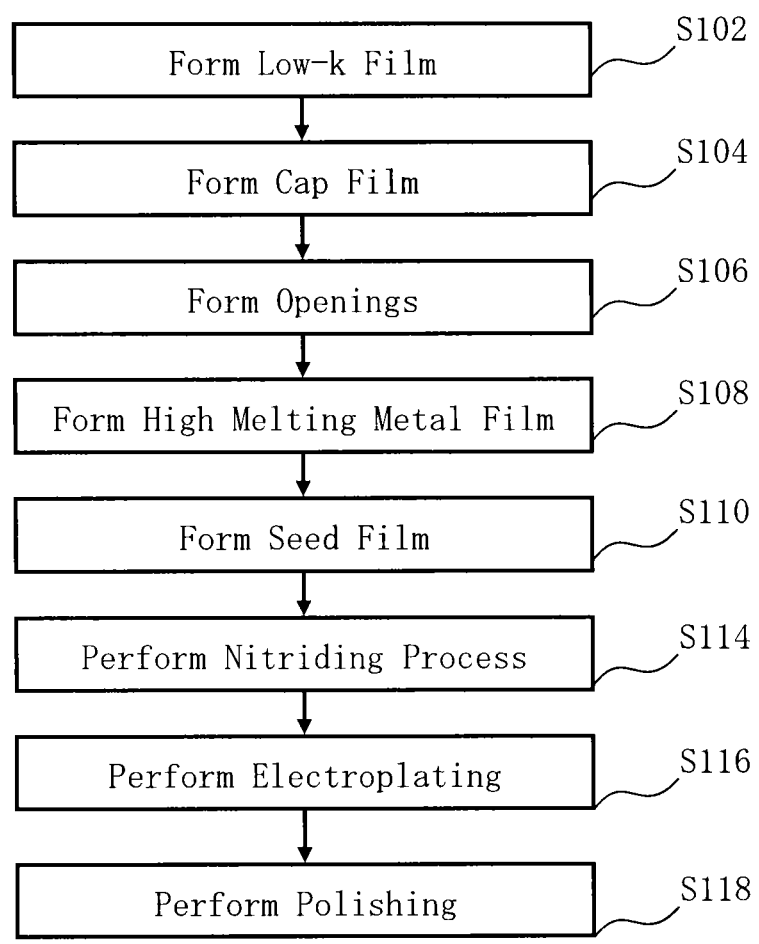
FIG. 1 is a flow chart illustrating a main part of a method for fabricating a semiconductor device according to a first embodiment.

FIG. 1 is a flow chart illustrating a main part of a method for fabricating semiconductor device according to first embodiment. In FIG. 1, in this embodiment, a low-k film forming step for forming a low-k film made of an dielectric material having a low dielectric constant (S102), a cap film forming step (S104), an opening forming step for forming openings (S106), a high melting metal film forming step (S108), a seed film forming step (S110), a nitriding process step (S114), an electroplating step (S116), and a polishing step (S118) are performed in series.

Figure 2A:
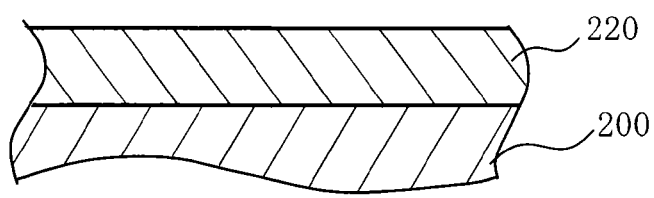
FIGS. 2A to 2C are step sectional views illustrating steps performed corresponding to the method for fabricating the semiconductor device according to the first embodiment.
Figure 2B:
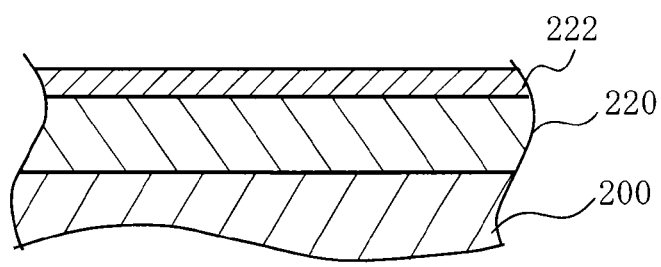
Figure 2C:
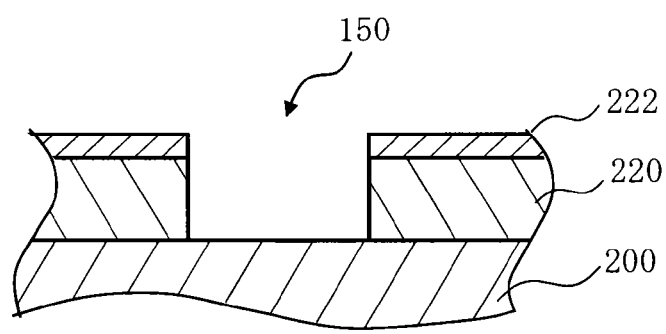

FIGS. 2A to 2C are step sectional views illustrating steps performed corresponding to the method for fabricating the semiconductor device according to the first embodiment. In FIGS. 2A to 2C, from the low-k film forming step (S102) to the opening forming step (S106) in FIG. 1 are illustrated. The steps thereafter will be described later.

In FIG. 2A, as the low-k film forming step (S102), a low-k film 220 made of a porous dielectric material having a low dielectric constant (an example of dielectric film), for example, is formed to have the thickness of 300 nm, for example, on a semiconductor substrate 200 as an example of a base substrate. By forming the low-k film 220, an inter-level dielectric film having a relative dielectric constant k of 3.0 or lower can be obtained. As a material for the low-k film 220, a porous silicon oxycarbide (SiOC) can be preferably used. With the porous SiOC film, an inter-level dielectric film having a relative dielectric constant k of 2.6 or lower, for example, can be obtained. As a forming method, PECVD process can be used for example. For example, a mixed gas including Methyl-di-ethoxy-silane, alpha-terpinene ($C_{10}H_{16}$), oxygen ($O_2$), and helium (He) is made to flow into a chamber, which is not shown, the semiconductor substrate 200 is heated to 250° C., for example, while keeping the pressure in the chamber at $1.3 \times 10^3$ Pa (10 Torr) or lower, and a high frequency power is supplied to a lower electrode and an upper electrode, which are not shown, in the chamber so as to generate a plasma. Methyl-di-ethoxy-silane is a gas for forming a main backbone structure component, and alpha-tepinene is a gas for forming a porogen component. And porogen contained in the SiOC film is heated to be gasified and removed. Then, cure by ultraviolet (UV) radiation is performed in nitrogen atmosphere at a temperature of 450° C., for example, higher than the temperature for removing porogen. Thus, the low-k film 220 as a porous dielectric film can be formed. The forming method is not limited to CVD process and SOD (spin on dielectric coating) method in which a solution is spin-coated and then a thermal process is performed to form a thin film is also preferable. As a material for the low-k film 220, a film having siloxane backbone structures having methyl siloxane as a main component, for example, is preferably used. A material of this type may be polymethylsiloxane, polysiloxiane, hydrogen silsesquioxane, methyl silsesquioxane, and the like. In addition, as a lower layer of the low-k film 220, a base film, which is not shown, is preferably formed. As a base film, oxide silicon ($SiO_2$), silicon carbon nitride (SiCN), silicon carbide (SiC), non-porous silicon oxycarbide (denseSiCO), or the like, for example, is preferable. As a forming method, PECVD process can be used, but the forming method is not limited thereto and the film may be formed by other methods. The base film may be formed to have a thickness of 20 nm, for example. As the semiconductor substrate 200, a silicon wafer having a diameter of 300 mm, for example, is used. In the drawings, a contact plug layer, device parts, and the like are not illustrated. On the substrate 200, a layer having various semiconductor elements or a structure such as other metal wires, which are not shown, may be formed. Alternatively, another layer may be formed.

As illustrated in FIG. 2B, as the cap film forming step (S104), a thin SiOC film 222 is formed by depositing silicon oxycarbide (SiOC) on the low-k film 220 to a thickness of 50 nm, for example, as a cap dielectric film by CVD process. The formation of the SiOC film 222 can protect the low-k film 220 that is difficult to perform lithography directly, and enables to form a pattern on the low-k film 220. The cap dielectric film may be formed by using, in addition to SiOC, at least one dielectric material selected from the group including silicon oxide ($SiO_2$), silicon carbide (SiC), silicon carbohydrate (SiCH), silicon carbon nitride (SiCN), and SiOCH, and having a relative dielectric constant of 2.5 or more. Although the film is formed by CVD process in this embodiment, other methods can be used.

As illustrated in FIG. 2C, an opening 150 is formed in the SiOC film 222 and the low-k film 220 as a wiring groove structure for forming damascene wires by a lithography step and a dry etching step as the opening forming step (S106). For example, a wiring groove having a width of 25 nm is formed. A resist film is formed on the SiOC film 222 through a lithography step including a resist coating step and an exposure step, which are not shown. As to the semiconductor substrate 200 formed with the resist film, the exposed SiOC film 222 and the low-k film 220 as a lower layer thereof are removed by an anisotropic etching process so that the opening 150 can be formed substantially orthogonal to the surface of the semiconductor substrate 200. For example, the opening 150 may be formed by reactive ion etching (RIE) process. In addition, if a base film as described above is formed as a lower layer of the low-k film 220, the base film may be also removed by an anisotropic etching process.

FIGS. 3A to 3D are step sectional views illustrating steps performed corresponding to the method for fabricating the semiconductor device according to the first embodiment. In FIGS. 3A to 3D, from the high melting metal film forming step (S108) to the electroplating step (S116) in FIG. 1 are illustrated. The steps thereafter will be described later.

Figure 3A:
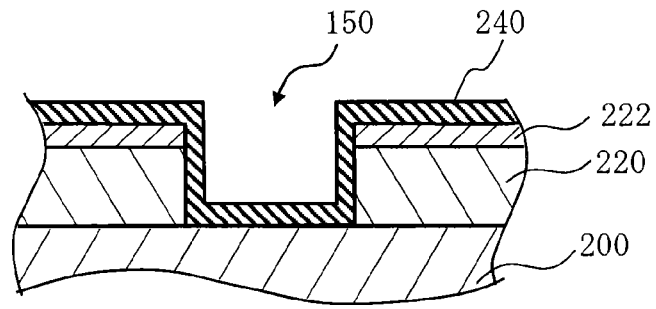
FIGS. 3A to 3D are step sectional views illustrating steps performed corresponding to the method for fabricating the semiconductor device according to the first embodiment.

In FIG. 3A, as the high melting metal film forming step (S108), a high melting metal film 240 using a barrier metal material is formed on the bottom surface and the side wall of the opening 150 formed by the opening forming step (S106) and on the surface of the SiOC film 222. The high melting metal film 240 is formed by depositing a titanium (Ti) film to have a thickness of 5 nm, for example, in a sputtering apparatus using sputter process that is one of physical vapor deposition (PVD) process. The high melting metal film 240 serves as a barrier metal film. As a material of the high melting metal film 240, tantalum (Ta) may be preferably used instead of Ti. If a Ti film is used as the barrier metal film, it is possible to diffuse Ti into a Cu film to be described later, and thus reliability of Cu wires can be improved. Further, adhesion to Cu can be improved comparing to a case where a nitride film such as a titanium nitride (TiN) film is used as the barrier metal film.

Figure 3B:
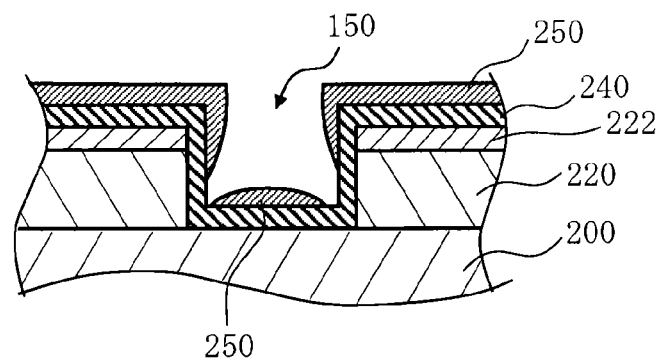

In FIG. 3B, as the seed film forming step (S110), a Cu thin film is deposited (formed) as a seed film 250 on the bottom surface and the side wall of the opening 150 and the surface of the substrate 200 where the high melting metal film 240 has been formed by physical vapor deposition (PVD) process such as sputtering. The Cu thin film is used as a cathode electrode in the electroplating step. In this embodiment, the seed film 250 is deposited on the substrate 200 to have a thickness of 20 nm, for example.

However, when an aspect ratio of grooves is increased with miniaturization in recent years, it is difficult to form the Cu seed film 250 on the side wall of the opening 150 (groove) with a sufficient amount. Therefore, so called film breakage where the Cu seed film 250 is not formed (does not exist) occurs as illustrated in FIG. 3B. The film breakage of the Cu seed film 250 tends to occur, especially on the side wall surface close to the bottom surface of the opening 150. At the film breakage portions, Ti as the high melting metal film 240 is exposed to the surface. If the process proceeds to the electroplating step (S116) to be described later with the portions where Ti is exposed to the surface, Ti oxide is easily formed, and the Ti oxide makes growth of Cu difficult. Therefore, in the first embodiment, generation of Ti oxide is suppressed.

Figure 3C:
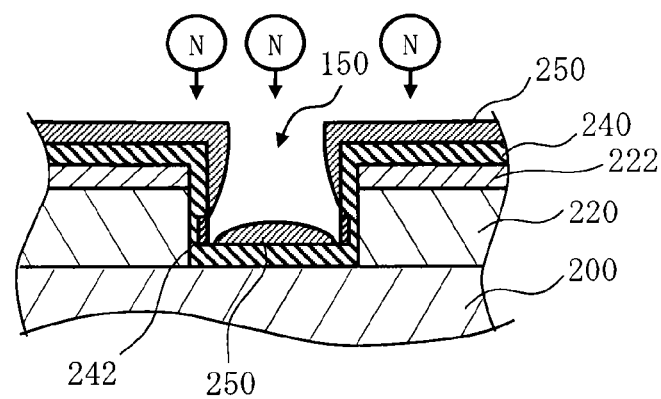

In FIG. 3C, a nitriding process is performed as the nitriding process step (S114) after the seed film 250 is formed. In this embodiment, the nitriding process is performed with the semiconductor substrate 200 having the seed film 250 formed thereon not to open to the atmosphere. The nitriding process is preferably performed by nitrogen ($N_2$) plasma process, ammonia ($NH_3$) plasma process, $N_2$ gas nitriding process, $NH_3$ gas nitriding process, or the like, for example.

For example, with $N_2$ plasma process, a nitride film 242 of the high melting metal film 240 can be formed at the portions where the high melting metal film 240 is exposed by placing the substrate after the high melting metal film 240 and the seed film 250 are formed in a chamber, which is not shown, while keeping it not to open to the atmosphere, and by exposing the substrate at the normal temperature, for example, to a plasma atmosphere while supplying $N_2$ gas into the chamber.

For example, with $NH_3$ plasma process, the nitride film 242 of the high melting metal film 240 can be formed at the portions where the high melting metal film 240 is exposed by placing the substrate after the high melting metal film 240 and the seed film 250 are formed in a chamber, which is not shown, while keeping it not to open to the atmosphere, and by exposing the substrate at the normal temperature, for example, to a plasma atmosphere while supplying $NH_3$ gas into the chamber.

For example, with $N_2$ gas nitriding process, the nitride film 242 of the high melting metal film 240 can be formed at portions where the high melting metal film 240 is exposed by placing the substrate after the high melting metal film 240 and the seed film 250 are formed in a chamber, which is not shown, while keeping it not to open to the atmosphere, and by exposing the substrate heated to 250° C., for example, to $N_2$ gas while supplying $N_2$ gas into the chamber.

For example, with $NH_3$ gas nitriding process, the nitride film 242 of the high melting metal film 240 can be formed at the portions where the high melting metal film 240 is exposed by placing the substrate after the high melting metal film 240 and the seed film 250 are formed in a chamber, which is not shown, while keeping it not to open to the atmosphere, and by exposing the substrate heated to 500° C., for example, to $NH_3$ gas while supplying $NH_3$ gas into the chamber.

In any methods described above, the chamber for performing the nitriding process can be the chamber where the seed film 250 has been formed, or can be another chamber. If the chamber where the seed film 250 has been formed is used, the substrate can be prevented from being open to the atmosphere (exposed to the atmosphere). Alternatively, if another chamber is used, the substrate may be transported under vacuum atmosphere without making the substrate open to the atmosphere.

When a Ti film is used as the high melting metal film 240, for example, a TiN film can be formed at the portions where Ti is exposed by performing such nitriding process. When a Ta film is used as the high melting metal film 240, for example, a TaN film can be formed at the portions where Ta is exposed. Such nitriding process can prevent formation of an oxide layer on the surface of the high melting metal film 240 exposed at the film breakage portions of the seed film 250.

Figure 3D:
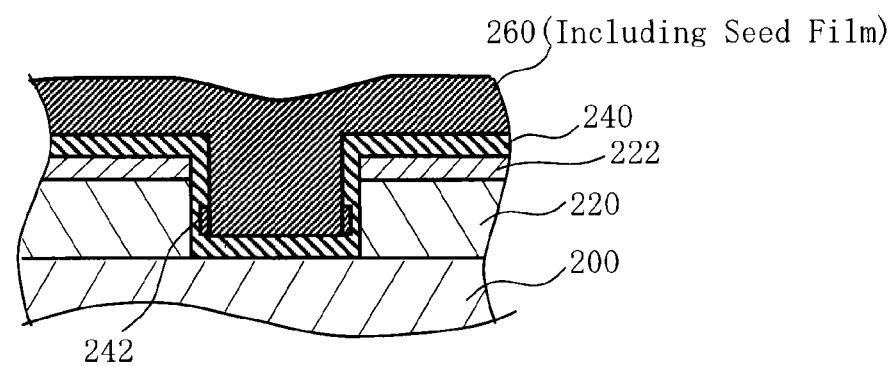

In FIG. 3D, as the electroplating step (S116), a Cu film 260 (an example of copper containing film) is deposited in the opening 150 and on the surface of the substrate 200 by an electrochemical growth method using electroplating while energizing using the seed film 250 as a cathode. In this embodiment, the Cu film 260 having a thickness of 600 nm, for example, is deposited to fully fill the opening 150 with the Cu film, and then an anneal process is performed at the temperature of 200° C. for 60 minutes after the deposition, for example.

Figure 4A:
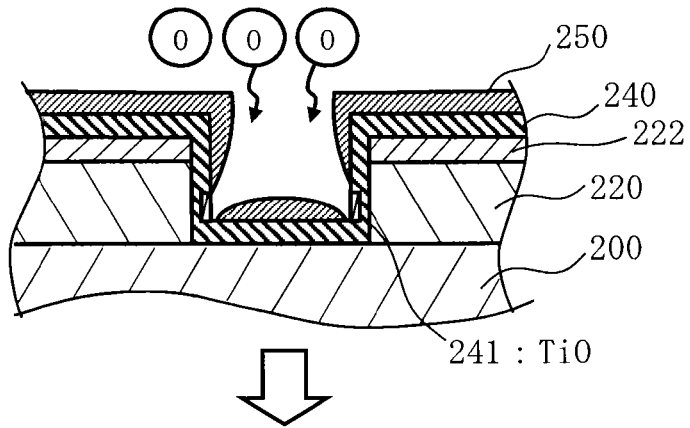
FIGS. 4A to 4C are sectional views for explaining effects of the first embodiment comparing to a comparative example.
Figure 4B:
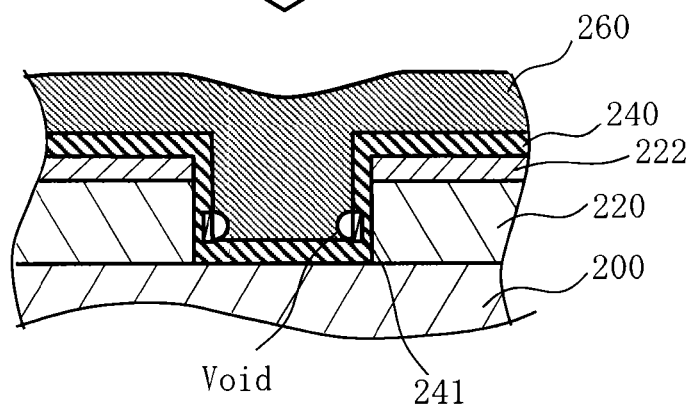
Figure 4C:
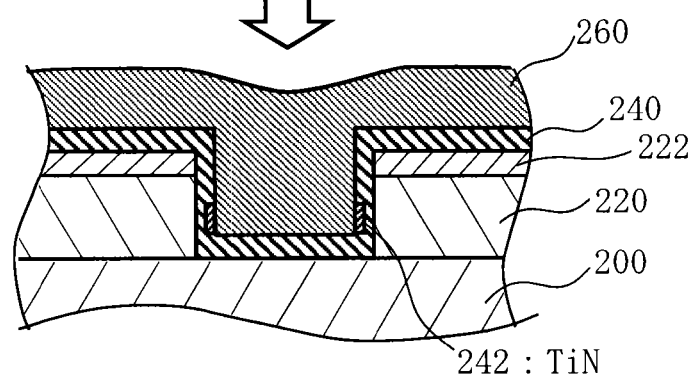

FIGS. 4A to 4C are sectional views for explaining effects of the first embodiment comparing to a comparative example. In a comparative example where the nitriding process step (S114) is not performed after the seed film 250 is formed as illustrated in FIG. 3C, the substrate is exposed to the atmosphere to proceed to the electroplating step (S116). As a result, as illustrated in FIG. 4A, an oxide 241 of the high melting metal film 240 is formed on the surface thereof at the portions where the seed film 250 is not formed and thus the high melting metal film 240 is exposed. When a Ti film is used as the high melting metal film 240, for example, a titanium oxide (TiO) film is formed at the portions where Ti is exposed. When a Ta film is used as the high melting metal film 240, for example, a tantalum oxide ($TaO_2$) film is formed at the portions where Ta is exposed. Thereafter, when the electroplating step (S116) is performed, the portions where the oxide 241 of the high melting metal film 240 is exposed is not energized, and thus Cu does not grow. As the plating process proceeds under this condition, voids are formed at the portions where the oxide 241 of the high melting metal film 240 is exposed as illustrated in FIG. 4B. On the other hand, in the first embodiment, the nitride film 242 of the high melting metal film 240 is formed at the portions where the high melting metal film 240 is exposed, and thus oxidation does not occur at the portions. Therefore, as illustrated in FIG. 4C, in the electroplating step (S116), Cu can be buried in the grooves without generation of voids at the portions where the nitride film 242 of the high melting metal film 240 is exposed.

Figures 5, 6:
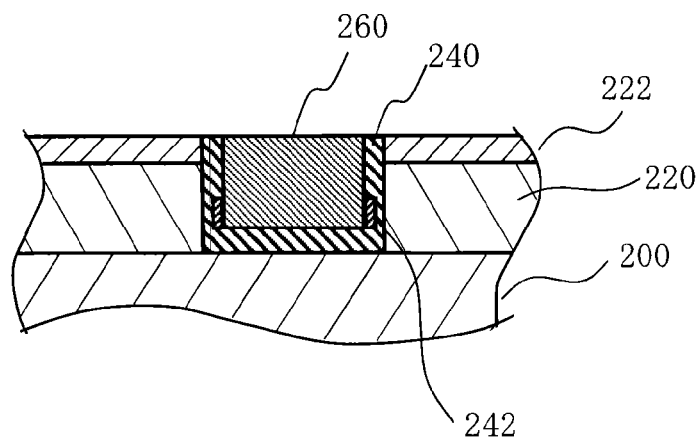
FIG. 5 is a step sectional view illustrating a step performed corresponding to the method for fabricating the semiconductor device according to the first embodiment.
FIG. 6 is a table showing an experimental result of a void formation rate and a faulty wiring rate in the first embodiment in comparison with the comparative example.

FIG. 5 is a step sectional view illustrating a step performed corresponding to the method for fabricating the semiconductor device according to the first embodiment. FIG. 5 illustrates the polishing step (S118) in FIG. 1.

In FIG. 5, as the polishing step (S118), the surface of the substrate 200 is polished by CMP method to remove, by polishing, the Cu film 260 containing the seed film 250 to be a wiring layer as a conductive part and the high melting metal film 240 deposited on the surface other than the opening, whereby the surface is planarized as illustrated in FIG. 5. As described above, damascene wires are formed.

The semiconductor device fabricated as described above includes: the Cu film 260 to be Cu wires; the high melting metal film 240; the nitride film 242 of the high melting metal film; and the low-k film 220 and the cap film 222 to be a dielectric film. The high melting metal film 240 is formed to cover the side surface and the bottom surface of the Cu film 260. The nitride film 242 of the high melting metal film is locally formed close to a contact point between the side surface and the bottom surface of the Cu film 260 in such a manner that the nitride film 242 is sandwiched between the Cu film 260 and the high melting metal film 240. In other words, the nitride film 242 of the high melting metal film is formed at a part of the interface between the Cu film 260 (Cu wires) and the high melting metal film 240. The low-k film 220 is formed at the side of the Cu film 260 with the high melting metal film 240 interposed therebetween.

In the first embodiment, since the Cu film and the Ti film, for example, contact each other at most of the bottom surface and the side wall of the opening 150 except for the portion where the film breakage of the seed film 250 has occurred, Ti can diffuse into Cu, and thus reliability of wires can be improved. Further, the use of Ti as a barrier metal film enables to improve adhesion to the Cu film comparing to a case where TiN is used as the barrier metal film. Similarly, when Ta is used as the barrier metal film, adhesion to the Cu film can be improved comparing to a case where TaN is used as the barrier metal film. In addition, at the portion where the film breakage of the seed film 250 has occurred that is a small portion of the bottom surface and the side wall of the opening 150, formation of an oxide film can be prevented in both cases of using Ti and Ta as the barrier metal film. Therefore, generation of void in Cu wires can be suppressed.

For example, in a case where a width of wiring grooves is 32 nm or less and a depth of wiring grooves is 80 nm or more and under a condition where a Cu seed film is formed to have a thickness of 20 nm or less, the film breakage of the Cu seed film especially tends to occur. Therefore, it is more effective to form Cu wires in the first embodiment.

FIG. 6 is a table showing an experimental result of a void formation rate and a faulty wiring rate in the first embodiment in comparison with the comparative example. In a process A listed in the table, a Ti film was formed to have a thickness of 5 nm by LTS sputtering method, a Cu seed film was formed to have a thickness of 20 nm in another chamber without being open to the atmosphere after the formation of the Ti film, and then a plating process was performed so as to form a Cu film. In a process B, a Ti film was formed to have a thickness of 5 nm by LTS sputtering method, $N_2$ plasma process was performed for 10 minutes without being open to the atmosphere after the formation of the Ti film to form a nitride on the Ti surface, a seed Cu film was then formed to have a thickness of 20 nm in another chamber also without being open to the atmosphere, and a plating process was thereafter performed so as to form a Cu film. In a process C (first embodiment), a Ti film was formed to have a thickness of 5 nm by LTS sputtering method, a seed Cu film was formed to have a thickness of 20 nm in another chamber without being open to the atmosphere after the formation of the Ti film, $N_2$ plasma process was performed for 10 minutes also without being open to the atmosphere, and a plating process was thereafter performed so as to form a Cu film.

In each of those three (A, B, C) processes, one hundred wires having a width of 20 nm were evaluated by cross section FIB-SEM analysis and a void formation rate was calculated. Similarly, electric characteristics after the expiration of 500 hours at 150° C. from the wire formation were checked so that a reliability failure rate of wires was measured. As shown in FIG. 6, the void formation rate was 75% in the process A, and was 0% in the processes B and C as a result of cross section FIB-SEM analysis of the wires having a width of 20 nm. In the process A, voids were formed from the side wall of the groove where it is difficult to form a seed Cu film. As described above, Ti oxide is easily formed at portions where Ti is exposed to the surface in the process A, and a plating film cannot be formed on the Ti oxide. Consequently, voids are formed in the following Cu plating film formation from the portions where Ti is exposed to the surface. On the other hand, in the process B, the Cu seed film is formed after the formation of TiN film as a barrier metal film and thus formation of Ti oxide is suppressed even at portions where the film breakage of the Cu seed film has occurred. This is thought to be the reason of suppression of void formation. In the process C, nitriding process is performed so that formation of Ti oxide is suppressed at the portions where Ti is exposed to the surface. This is thought to be the reason of suppression of void formation.

As described above, according to the first embodiment, voids are not easily formed between the nitride film of the high melting metal film 240 and the Cu film 260 (Cu wires), and the nitride film of the high melting metal film 240 can be positioned to contact the Cu film 260 (Cu wires).

Reliability failure rates of wires were 80% in the process A, 65% in the process B, and 0% in the process C, as shown in FIG. 6. In the process A, failure was significant in micro wires having a width about 25 nm, and the reason is thought to be burying failure checked by the cross section FIB-SEM analysis. In the process B, failure was significant in wide wires having a width of 500 nm or more, and the reason is thought to be degradation of stress migration resistance caused by TiN formed on the whole interface between Ti and Cu, which suppresses diffusion of Ti into Cu. On the other hand, in the process C, the nitriding process was performed only at the portions where Ti was exposed to the surface so that diffusion of Ti into Cu was not inhibited. This is thought to be a reason of good wire reliability.

The embodiment is described with reference to the concrete examples. However, the present disclosure is not limited to the concrete examples. In the embodiment described above, the low-k film 220 was used as a dielectric film, but the dielectric film is not limited thereto and other dielectric materials can be used. For example, a silicon dioxide film ($SiO_2$) can be used. In addition, the cap film 222 may be eliminated. Further, in the embodiment, damascene wires are described. However, the present disclosure is effective also for dual damascene wires. In particular, the present disclosure is preferable to bury Cu into via holes upon formation of dual damascene wires.

In addition, a thickness of the inter-level dielectric film and a size, a shape, the number of the openings may be appropriately selected for a semiconductor integrated circuit or a semiconductor device of various types.

In addition, all semiconductor devices and all methods for fabricating a semiconductor device which include the elements of the present disclosure and can be arbitrarily changed in design by those skilled in the art are included in the spirit and scope of the disclosure.

In addition, to simplify the description, processes that are generally used in semiconductor industry including photolithography process, cleaning before and after each process, for example are not described. However, it is obvious that those processes can be included.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A method for fabricating a semiconductor device, the method comprising:
   forming a dielectric film above a substrate;
   forming an opening in the dielectric film;
   forming a high melting metal film on a side wall and a bottom surface of the opening;
   forming a seed film of copper (Cu) on the high melting metal film;
   performing nitriding process after the seed film is formed; and
   performing electroplating process, in which a Cu film is buried in the opening while energizing the seed film after performing nitriding process.

2. The method according to claim 1, wherein a titanium (Ti) film is used as the high melting metal film.

3. The method according to claim 1, wherein a tantalum (Ta) film is used as the high melting metal film.

4. The method according to claim 1, wherein one of ammonia ($NH_3$) plasma process and nitrogen ($N_2$) plasma process is performed as the nitriding process.

5. The method according to claim 4, wherein the nitriding process is performed at a normal temperature.

6. The method according to claim 1, wherein as the nitriding process, one of ammonia ($NH_3$) gas process and nitrogen ($N_2$) gas process is performed while heating the substrate.

7. The method according to claim 1, wherein the nitriding process is performed without being open to an atmosphere after forming the seed film.

8. The method according to claim 7, wherein the nitriding process is performed using the same chamber as that used for forming the seed film.

9. The method according to claim 7, wherein the nitriding process is performed using a different chamber from that used for forming the seed film.

10. The method according to claim 1, wherein when the seed film is formed, the high melting metal film is exposed from the seed film on the side wall surface close to the bottom surface of the opening.

11. The method according to claim 2, wherein when the seed film is formed, the Ti film is exposed from the seed film on the side wall surface close to the bottom surface of the opening.

12. The method according to claim 3, wherein when the seed film is formed, the Ta film is exposed from the seed film on the side wall surface close to the bottom surface of the opening.

13. The method according to claim 2, wherein titanium nitride (TiN) is formed at a portion where film breakage of the seed film occurs, by the nitriding process.

14. The method according to claim 3, wherein tantalum nitride (TaN) is formed at a portion where film breakage of the seed film occurs, by the nitriding process.

15. The method according to claim 1, wherein physical vapor deposition (PVD) process is used for forming the high melting metal film.

16. A semiconductor device comprising:
a copper (Cu) wire;
a high melting metal film formed to cover a side surface and a bottom surface of the Cu wire;
a nitride film of the high melting metal film locally formed close to a contact point between the side surface and the bottom surface of the Cu wire in such a manner that the nitride film is sandwiched between the Cu wire and the high melting metal film; and
a dielectric film formed at a side of the copper wire with the high melting metal film interposed therebetween,
wherein titanium (Ti) is used as the high melting metal film, and the Ti diffuses into the Cu wire.

17. The device according to claim 16, wherein the nitride film of the high melting metal film contacts the Cu wire.

* * * * *